United States Patent [19]

Feng

[11] Patent Number: 4,879,806

[45] Date of Patent: Nov. 14, 1989

[54] TOOL FOR DIP-TYPE ICS

[76] Inventor: Yee C. Feng, 5F-1, No. 189, Chang An E. Rd., Sec. 2, Taipei, Taiwan

[21] Appl. No.: 227,876

[22] Filed: Aug. 3, 1988

[51] Int. Cl.$^4$ .............................................. H05K 3/30
[52] U.S. Cl. .................................... 29/741; 29/401.1; 29/758; 29/764; 81/423
[58] Field of Search ................. 29/741, 739, 758, 764, 29/278, 401.1; 81/423

[56] References Cited

U.S. PATENT DOCUMENTS 3,253,327  5/1966  McElligatt ........................ 29/758 X
4,141,138  2/1979  Quick ................................ 29/764 X
4,605,256  8/1986  Stokoe ................................ 29/758

FOREIGN PATENT DOCUMENTS 594029 10/1947 United Kingdom .................. 81/423

Primary Examiner—Carl E. Hall
Attorney, Agent, or Firm—Varndell Legal Group

[57] ABSTRACT

A tool for a DIP-type IC includes an inverted U-shaped body having two elastic parallel arms respectively having two free ends, and a working medium mounted on the free ends. The tool is capable of both inserting an IC on a PCB and removing the IC from the PCB.

9 Claims, 2 Drawing Sheets

TOOL FOR DIP-TYPE ICS

BACKGROUND OF THE INVENTION

The present invention relates to a tool for ICs, and, more particularly, to a tool for DIP-type ICs.

PCBs (printed circuits boards) play an extremely important role in the fields of computers and electronics. These PCBs have small circular holes electrically connected together by conductive strips for insertion therein of, inter alia, DIP-type ICs of various sizes. If the ICs are found to be damaged or if it is determined they are of a wrong type after testing, the ICs must be removed or disengaged from the PCBs. Thus, tools enabling DIP-type ICs to be inserted on the PCB and tools enabling DIP-type ICs to be disengaged from the PCB have been developed. However, the former tools cannot serve the function the latter tools provide, and vice versa. Furthermore, each of these prior tools is designed to be used for ICs of a particular size. This results in the need of the work place having a large number of such tools on hand which is inconvenient and expensive.

SUMMARY OF THE INVENTION

It is therefore an object of the present invention to provide a tool for DIP-type which can be used for both inserting a DIP-type IC on a PCB and for removing it from the PCB.

According to the present invention, a tool for a DIP-type IC includes an inverted U-shaped body having two elastic parallel arms respectively having two free ends. Means are mounted on the free ends of the tool and can be used to insert the IC on a PCB in a first instance and to remove the IC from the PCB in a second instance.

The means can include two relatively small pieces laterally extending from each of the two free ends. These pieces face each other and can be urged against the bottom surface of the IC to facilitate removing the IC by pulling upwards on the U-shaped body.

The means can further include two end pieces, each having two projected portions facing each other. The end pieces are respectively secured to each of the two free ends and are arranged to clamp the IC therebetween while the projected portions are urged against the top surface of the IC. With this arrangement, the IC can be inserted on the PCB by pushing downwards on the U-shaped body.

The present invention may best be understood through the following description with reference to the accompanying drawings.

DETAILED DESCRIPTION OF THE PREFERRED EMBODIMENT

Figure 1:
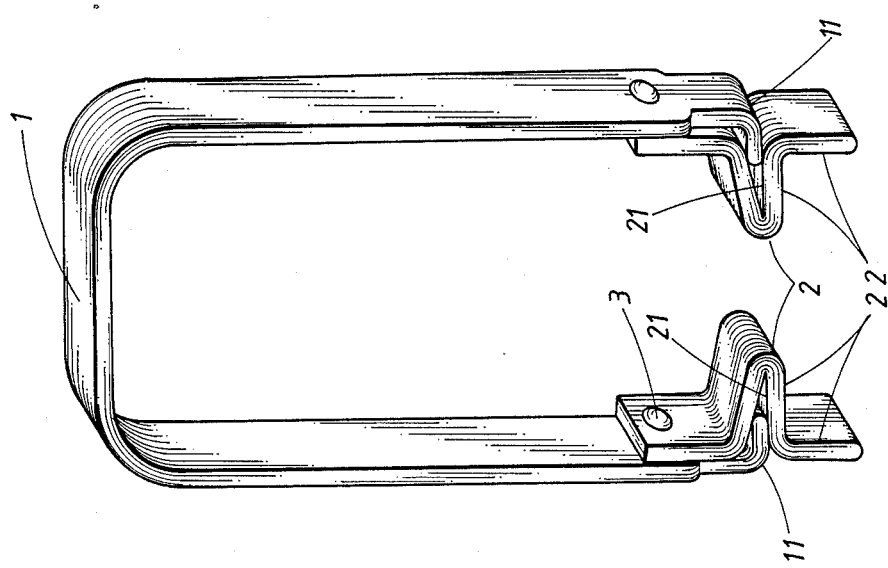
FIG. 1 is a perspective view showing a tool according to the present invention providing for an IC to be inserted on a PCB.

Referring now to the drawings, a tool for a DIP-type IC (A) according to the present invention includes an inverted U-shaped body 1 having two parallel arms made of a spring steel respectively having two free ends, and means (11, 2) mounted on the free ends. The means are capable of inserting IC (A) on a PCB in a first instance and disengaging or removing IC (A) from the PCB in a second instance. For removal, the means (11, 2) includes two relatively small pieces 11 laterally extending from and integrally formed with the two free ends respectively so as to face each other. When the small pieces 11 are urged against a bottom surface of IC (A), IC (A) will be disengaged from a PCB by pulling the U-shaped body 1 upwards.

Figure 3:
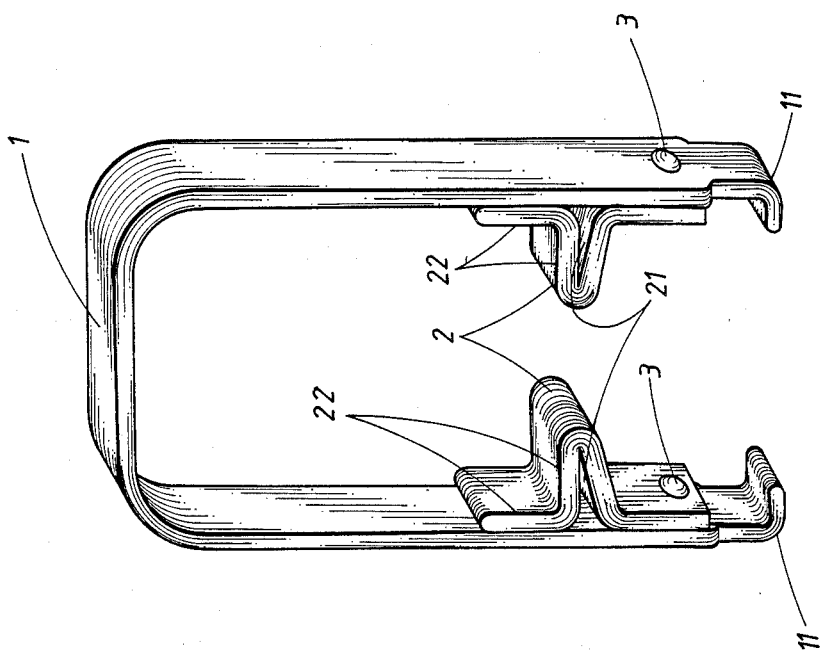
FIG. 3 is a perspective view showing the tool in FIG. 1 providing for an IC to be disengaged from a PCB.
Figure 2:
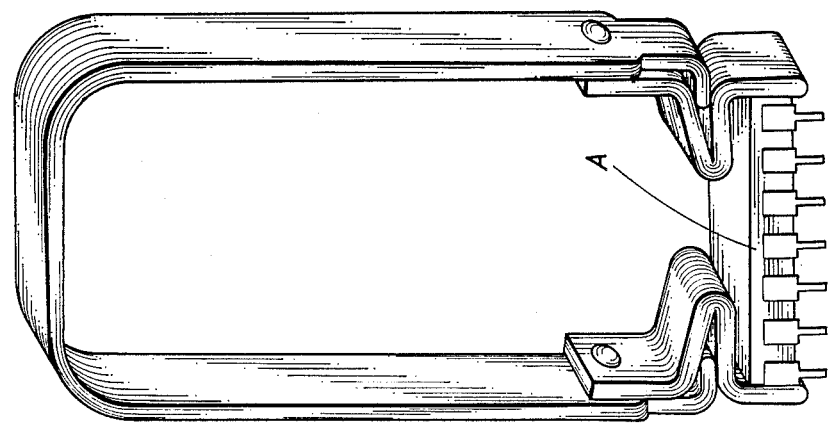
FIG. 2 is a perspective view of the tool in FIG. 1 in operation.
Figure 4:
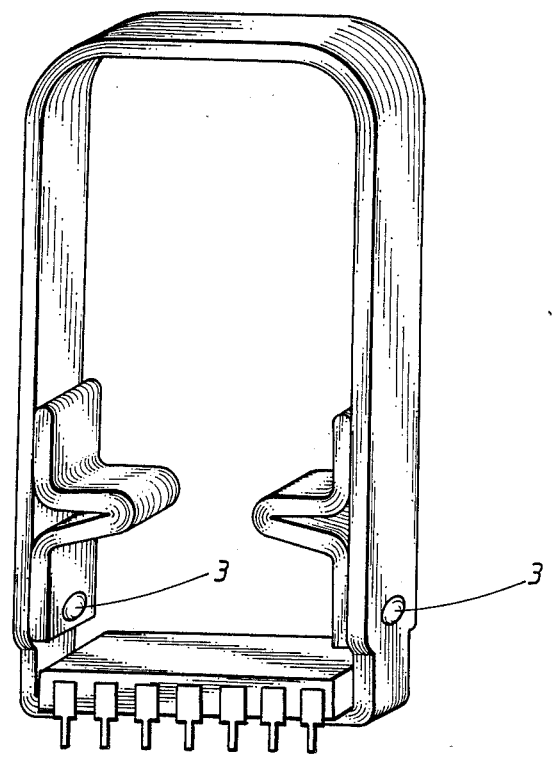
FIG. 4 is a perspective view of the tool in FIG. 3 in operation.
Figure 5:
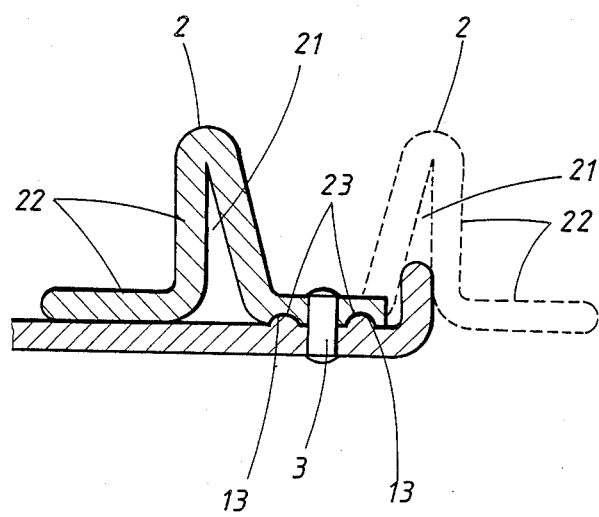
FIG. 5 is a schematic view showing how a working medium of the tool in FIG. 1 engages with the inverted U-shaped body.

For inserting an IC, means (11, 2) further includes two end pieces 2 respectively having two projecting portions which define therein a space or notch 21 capable of receiving a respective small piece 11. The projecting portion face each other and are each pivotally secured to the two free ends respectively at the inner sides thereof by two pins 3 on two vertically opposite sides of the inner side surface of each arm of body 1. Each arm is provided with two ridges 13, one of which matches with a recess 23 provided on the end piece 2 when piece 2, is upwardly pivoted (see FIGS. 3 and 4 and the solid piece 2 in FIG. 5.). The other ridge 13 matches with recess 23 when piece 2 is downwardly pivoted (see FIGS. 1 and 2 and the dotted piece 2 in FIG. 5.), such that when angled surfaces 22 of end pieces 2 clamp IC (A) therebetweenn and urge against a top surface of IC (A) so the IC (A) can be inserted on a PCB when the U-shaped body 1 is pushed downwards. As shown in the drawings, end pieces 2 have a space 21 of triangular-shaped cross-section. However, the space 21 can be differently shaped, e.g., square-shaped cross-section. Since body 1 is made of the spring steel and thus will be elastic, the present tool can work with different sizes of DIP-type ICs.

Through the above description, it should now be readily apparent how and why the present invention can achieve the objects it contemplates.

What I claim is:

1. A tool for a DIP-type IC comprising:
   an inverted U-shaped body having two elastic parallel arms respectively having two free ends and means for inserting said IC on a PCB and for removing said IC from said PCB,
   said means including a lip on each of said free ends for removing said IC and an end piece rotatably fastened to each arm, each end piece having a surface for inserting said IC and a recess for covering said lip during said inserting, whereby said end piece is rotated away from said lip during said removing and is rotated to cover said lip during said inserting.

2. A tool according to claim 1 wherein said U-shaped body is made of a spring steel.

3. A tool according to claim 1 wherein each said end piece is pivotable on a plane containing a side surface of one of said arms.

4. A tool according to claim 1 wherein each said end piece is pivotable on a plane containing a side surface of an inner side of one of said arms.

5. A tool according to claim 1 wherein said surface of said end piece includes two projecting portions joined at one end and providing a space therebetween for covering said lip.

6. A tool according to claim 1 wherein:
said tool includes a pin for pivotally fastening one of said end pieces to a side surface of one of said arms;
said one arm including two ridges respectively provided on opposite sides of said pin on said one arm; and
said one end piece including a recess for engaging either one of said ridges.

7. A tool according to claim 6 wherein said ridges and said recess cooperate to lock said one end piece in one of a position for inserting said IC on said PCB and for removing said IC from said PCB.

8. A tool according to claim 5 wherein said space has a triangular-shaped cross-section.

9. A tool according to claim 5 wherein said space has a square-shaped cross-section.

* * * * *